United States Patent
Hurditch et al.

(10) Patent No.: US 6,395,449 B1
(45) Date of Patent: May 28, 2002

(54) POLY-HYDROXY AROMATIC DISSOLUTION MODIFIERS FOR LIFT-OFF RESISTS

(75) Inventors: Rodney J. Hurditch, Providence, RI (US); Daniel J. Nawrocki, Newton; Mark J. Shaw, Norfolk, both of MA (US)

(73) Assignee: MicroChem Corp., MA (US)

( * ) Notice: Subject to any disclaimer, the term of this patent is extended or adjusted under 35 U.S.C. 154(b) by 0 days.

(21) Appl. No.: 09/540,791

(22) Filed: Mar. 31, 2000

(51) Int. Cl.[7] .................................................. G03C 1/72
(52) U.S. Cl. .................. 430/270.1; 430/320; 430/271.1; 430/156
(58) Field of Search .......................... 430/270.1, 175, 430/171, 320, 273.1, 271.1, 272.1

(56) References Cited

U.S. PATENT DOCUMENTS

| | | | |
|---|---|---|---|
| 2,146,209 A | | 7/1939 | Graves et al. |
| 3,284,425 A | | 11/1966 | Schröder et al. |
| 4,246,374 A | | 1/1981 | Kopchik ...................... 525/329 |
| 4,524,121 A | | 6/1985 | Gleim et al. ................. 430/176 |
| 4,569,897 A | * | 2/1986 | Kalyanaraman ............. 430/197 |
| 4,631,249 A | * | 12/1986 | Kalyanaraman ............. 430/325 |
| 4,636,532 A | | 1/1987 | Sandford ........................ 522/3 |
| 4,689,243 A | | 8/1987 | Sasaki et al. ............... 427/54.1 |
| 4,806,453 A | * | 2/1989 | Vidusek et al. ............. 430/312 |
| 4,814,258 A | | 3/1989 | Tam ............................ 430/315 |
| 4,818,658 A | * | 4/1989 | Martin et al. ................ 430/156 |
| 5,106,718 A | * | 4/1992 | Bartmann et al. ........... 430/191 |
| 5,436,098 A | * | 7/1995 | Schulz et al. .................. 430/17 |
| 5,604,073 A | | 2/1997 | Krounbi et al. ................ 430/14 |
| 5,871,872 A | * | 2/1999 | Matijevic et al. ............... 430/7 |
| 6,228,552 B1 | * | 5/2001 | Okino et al. ................. 430/176 |

FOREIGN PATENT DOCUMENTS

| | | | |
|---|---|---|---|
| EP | 0 275918 | 7/1988 | ............. C08F/8/30 |
| EP | 0 341843 | 11/1989 | ............. G03F/7/02 |

\* cited by examiner

*Primary Examiner*—Janet Baxter
*Assistant Examiner*—Yvette M. Clarke
(74) *Attorney, Agent, or Firm*—William A. Simons; Wiggin & Dana

(57) ABSTRACT

Compositions useful for a lift-off resist in a bilayer metal lift-off process which comprise a mixture of at least one solvent, at least one polyglutarimide resin and an effective amount of at least one dissolution rate modifier selected from a group consisting of 2,3,4,2',3',4'-hexahydroxybenzophenone; hexahydroxyspirobiindane; 2,4,2',4'-tetrahydroxybenzophenone; 1,1,1-tris-hydroxyphenylethane; 1,7-bis-(hydroxy-3-methoxyphenyl)-1,6-heptadiene-3,5-dione and at least one arylsulfonate ester of these poly-hydroxy aromatic compounds.

18 Claims, No Drawings

POLY-HYDROXY AROMATIC DISSOLUTION MODIFIERS FOR LIFT-OFF RESISTS

BACKGROUND OF THE INVENTION

1. Field of the Invention

The present invention relates to selected compositions useful as a lift-off photoresist in a bilayer metal lift-off process. In particular, this invention relates to specific compositions useful for that purpose that include at least one solvent, at least one polyglutarimide resin and at least one selected poly-hydroxy aromatic compounds or arylsulfonate esters thereof.

2. Brief Description of Art

The additive process of depositing patterned metal films onto microelectronic substrates is known as the lift-off process or metal lift-off process. There are several variations of this lift-off process. The most widely used lift-off processes involve a bilayer lithographic process (sometimes also referred to as a "bilevel" process). Such bilayer lift-off processes have been used to deposit the metallic "read-stripe" in the manufacture of thin film heads for magnetic hard drives and in the fabrication of the gate oxide for GaAs Field Effect Transistor (FET) devices. Variants of these bilayer lift-off processes are described in detail in European Patent Application No. 0341843 (assigned to International Business Machines Corp.) and U.S. Pat. No. 4,814,258 (assigned to Motorola Inc.).

In bilayer lift-off processes, a solution of a non-imaging lift-off resist (LOR) is first deposited by spin-coating to form a uniform thin film on top of a substrate to be metallized. The LOR layer is then soft-baked by heating at a sufficiently high temperature to remove most of the solvent contained in it. A conventional positive-imaging resist layer is then deposited on top of the LOR. The top resist and the lower LOR layer should not be intermixed. Therefore, the LOR should have a low solubility in conventional positive resist solvents.

After a second soft-bake to remove most of the residual solvent in the top resist layer, a pattern is transferred from a mask to the top resist film using a conventional microlithographic imaging tool such as a contact-proximity printer or stepper. The exposed areas in the top resist layer represent the areas to be metallized. The exposed resist is developed with an aqueous developer through to the LOR layer, which then dissolves both vertically through to the substrate and laterally to penetrate a small predefined distance into the adjacent unexposed areas of the photoresist layer. This lateral dissolution produces a controlled degree of undercut in a development time which is neither too long to make the process impractical or to remove too much unexposed photoresist, or too short to make the process irreproducible. In one variation of the process, often referred to as the PCM (portable conformable mask) variation, the underlying LOR is photosensitive in the deep ultra-violet (DUV) spectral rangeand the positive-imaging top resist is of the novolak-diazonaphthoquinone type. The latter absorbs in the DUV and acts as a mask to an intermediate DUV flood exposure. This renders the lower LOR layer more soluble in a selected developer in the exposed areas that are to be removed during the development process. It is preferred to avoid a DUV intermediate exposure step and rely instead on the LOR having the desired rate of dissolution in the positive imaging resist developer. Moreover, this PCM process cannot be used with a positive top resist of the chemically amplified type designed to be photosensitive to DUV wavelengths.

After the desired degree of undercut is developed in the LOR layer, the metal layer is blanket-deposited by sputtering. The undercut ensures a discontinuity between the metal on top of the resist and the metal in the trench formed by the lithographic process. By this means, upon subsequent stripping of the remaining top photoresist and the LOR, the metal deposited on top of the resist is cleanly separated from the metal deposited on the substrate, ensuring consistent profiles and critical dimensions of the metal pattern. The degree of undercut, and hence the lateral dissolution rate, must be carefully controlled.

Partially or fully imidized acrylic polymers referred to as polyglutarimides, especially polydimethylglutarimide (PMGI), have been described in U.S. Pat. No. 4,524,121 (assigned to Rohm and Haas Co.). Polyglutarimide refers to a class of polymers containing partially cyclized imide and N-alkyl imide moeties and uncyclized polymethacrylate, in which the degree of cyclization as well as the ratio of N-alkyl to N—H can vary widely depending on the starting materials and the process used in the preparation. In the case where the alkyl group is methyl, the polymer is more correctly referred to as polydimethylglutarimide, or PMGI. If PMGI is made from polymethacrylic acid or a PMMA/methacrylic acid copolymer, (uncyclized) poly (methacrylicacid) units may also be present. PMGI polymers for lift-off applications are generally found to comprise about 65%–80% or more of cyclized imide moieties of which about 50–60% are N—H and the remainder N-methyl substituted. These compounds have several desirable properties, especially good solubility in aqueous bases typically used for the development of conventional positive resists, and poor solubility in positive resist solvents such as ethyl lactate, 2-heptanone and propylene glycol methyl ether acetate, which make them suitable for use in lift-off resists for bilayer lift-off process applications. Additionally, their solubility may be increased by exposure to high energy radiation such as deep ultra-violet (DUV) or electron beam.

The basic reaction to form poly(N-alkylimides) from the reaction of poly(methylmethacrylate)(PMMA) or poly (methacrylic acid) with an amine is disclosed in Graves U.S. Pat. No. 2,146,209, (assigned to E.I. du Pont de Nemours & Co.), see German Patent No. 1,077,872, and *Makromol. Chem.* 96, 227 (1966).

European Patent Application No. A0275918 (assigned to Verdril S.p.A.) discloses a solution process for making imidized acrylic polymers by reaction of acrylic resin with an amide. U.S. Pat. No. 4,689,243 (assigned to Mitsubishi Rayon Co.) discloses a process for forming polyglutarimide polymers by reaction of a solution of PMMA with ammonia or an amine, followed by separation of the polymer from non-polymeric reaction products and solvents under vacuum in a vent extruder. As described in U.S. Pat. No. 3,284,425, the same reaction is carried out in a suspending solvent in an autoclave.

In any practical lift-off process, it is desirable to adjust and maintain precise control of the dissolution rate of the lift-off resist layer, so that the required degree of undercut is always obtained in a relatively short time using a developer which is compatible with, and provides a wide process latitude for the imaging positive photoresist layer.

Commercially available PMGI has been manufactured by the process described in U.S. Pat. No. 4,246,374 (assigned to Rohm and Haas). In this process, poly(methyl methacrylate) (PMMA) is imidized with ammonia gas in an extruder at high pressure and relatively high temperature. This reaction is practical only if the weight-average molecular weight ($M_w$) of the starting PMMA is sufficiently high (i.e. greater than 60,000 and typically 60,000 to 120,000).

The resulting polymer should also contain about 20–35% of unreacted methacrylate moieties and about 30–60% of the nitrogen atoms on the imide groups should be methylated. The percentage of the remaining imide groups (N—H) determines the alkaline solubility. PMGI resins produced by this process have a fairly narrow range of alkaline solubility. This limitation creates the need for other methods of modifying the dissolution rate of these PMGI resins.

One such method is to reduce the molecular weight of PMGI by exposing the polymer to DUV radiation. This method has been described in U.S. Pat. No. 4,636,532 (assigned to Shipley Co.) By this means, the dissolution rate of PMGI, and hence the rate of undercut, can be increased to some extent. However, the amount of increase in the dissolution rate may be insufficient for certain lift-off processes requiring a relatively large rate of undercut to be useful with certain developers.

Additionally, the dissolution rate and hence the degree of undercut can also be adjusted somewhat by changing the conditions under which the spin-coated LOR film is soft-baked, especially the bake temperature. This arises because the dissolution rate of solvent-cast PMGI, like other polymers, is strongly dependent upon the concentration of solvent retained in the cast film. However, controlling the dissolution rate by this means is somewhat limited in practice, since other process requirements generally restrict the bake temperature range. For example, in the lift-off process commonly used in the manufacture of thin film heads, the maximum soft-bake temperature is generally about 160–170° C. in order to minimize adverse effects on the magnetic properties. Moreover, the rate of decrease of the dissolution rate of a PMGI LOR with temperature tends to become small above about 190° C., when most of the casting solvent has been removed. For all lift off-processes, the recommended minimum bake temperature to produce good reproducibility in a PMGI LOR is about 150° C. Below 150° C., the dissolution rate tends to change very rapidly as a function of the bake temperature, exposure energy, time of development and other process parameters, which results in a narrow process window.

A further method of controlling the dissolution rate has been to change the conditions of the development process, such as varying the type or normality of the developer or the development time. When an advanced-type commercial positive resist is used for the top layer, it is desirable to use a developer which is optimally selected to provide the widest process window when used in conjunction with that photoresist. Such a developer may be of a type or normality which is less suited to achieve the desired rate of undercut in the LOR layer. This may lead to a development time that is too long or too short, or a soft-bake temperature that is too high or too low for optimum undercut. Thus, there is a need for other methods of controlling dissolution rates besides the type and normality of developer.

As the size of the features in the metal patterning process decreases, which is the trend in FET device and thin film head technologies, the degree of undercut required for the same development time also decreases, and hence there is a need to reduce rather than increase the PMGI dissolution rate after baking.

It has been determined that the use of lower dissolution rate, high molecular weight PMGI as the resin in an LOR lift-off processes can result in the formation of residue frequently referred to as scum, which retards the lateral dissolution and may give rise to defects in the final device. The propensity for the formation of scum is greater at lower rates of dissolution, especially if the undercut rate is about 0.3 microns per minute or slower, which may be the case if the width of the metal feature of the lift-off process is less than about one micron. The propensity for the formation of scum diminishes if a low molecular-weight PMGI resin is used; however, such a resin has a relatively high dissolution rate compared with that ideally required for sub-micron processes requiring low rates of undercut.

Additionally, the positive photoresist selected for imaging a fine pattern is usually of an advanced type typically used in the fabrication of sub-micron semiconductor devices. These positive photoresists have been optimized for use with a specific normality of tetramethyl ammonium hydroxide (TMAH) developer (e.g. 2.38% by weight of TMAH in deionized water with or without an added surfactant). However PMGI resins, especially those having a low molecular weight, and, therefore, having a low propensity to scum, even after soft-baking at 200° C., tend to dissolve too rapidly in 2.38% TMAH developer so that it is difficult to obtain the desirable low undercut rate.

There is, therefore, a need to modify the dissolution rate of a lift-off resist, in a manner which results in precise control of the undercut rate, does not produce undesirable scum, permits the choice of a developer composition which is most compatible with the imaging photoresist, and maintains a wide process window for the lift-off process, especially when the degree of undercut required is to be relatively small. The present invention is a solution to this need.

BRIEF SUMMARY OF THE INVENTION

Therefore, one aspect of the present invention is directed to compositions useful for a lift-off resist in a bilayer metal lift-off process which comprise a mixture of at least one solvent, at least one polyglutarimide resin and an effective amount of at least one dissolution rate modifier selected from a group consisting of 2,3,4,2',3',4'-hexahydroxybenzophenone; hexahydroxyspirobiindane; 2,4,2',40 -tetrahydroxybenzophenone; 1,1,1-tris-hydroxyphenylethane; 1,7-bis-(4-hydroxy-3-methoxyphenyl)-1,6-heptadiene-3,5-dione and at least one arylsulfonate ester of these poly-hydroxy aromatic compounds.

Another aspect of the present invention is directed to composite articles which comprise (1) a microelectronic substrate; (2) a layer of lift-off resist as described above lying on top of the substrate; and (3) a layer of positive-imaging photoresist lying on top of the layer of lift-off resist.

It is an advantage of the present invention to provide dissolution rate modifiers which are soluble in solvents suitable for dissolving polyglutarimide resins such as PMGI, are miscible with PMGI over a wide composition range, do not impair the film-forming characteristics of the lift-off resist, have melting points which are sufficiently high, do not decompose or volatilize on heating at the maximum temperature used in the application. Another advantage of the present invention is that these dissolution modifiers may be combined with a polyglutarimide resin to produce a LOR that does not form scum.

Other specific advantages of the present invention include a LOR having the wide range of dissolution rates, which are obtained without having to vary the soft-bake temperature, bake time or development time. Another advantage is the compatibility of the LOR with metal-ion-containing developers of low normality. A particular advantage is that a low molecular weight PMGI resin, which is less prone to form scum than a high molecular weight PMGI resin of lower dissolution rate, may be used as the polymer component of an LOR. Another advantage is that a more aggressive tetramethyl ammonium hydroxide (TMAH) containing developer, which is compatible with an advanced positive resist of the type frequently used for sub-micron photolithographic processes, may also be used.

DETAILED DESCRIPTION OF THE INVENTION

The term "polyglutarimide" as used in the present specification and claims means a class of polymers containing partially cyclized imide and N-alkyl imide moieties and uncyclized polymethacrylate, in which the degree of cyclization as well as the ratio of N-alkyl to N—H can vary widely depending on the starting materials and the process used in the preparation. The terms "polydimethylglutarimide" or "PMGI" as used in the present specification and claims means a polyglutarimide produced by the imidization of polymethylmethacrylate (PMMA) in which the N-alkyl group is methyl.

In accordance with the present invention, the rate of undercut of a polyglutarimide lift-off resist layer can be substantially increased or decreased by the use of one or more of the above-noted poly-hydroxy aromatic compounds or arylsulfonic esters of those poly-hydroxy aromatic compounds or mixtures of such compounds and esters as the dissolution rate modifier. These poly-hydroxy aromatic compounds are non-subliming, have a melting point greater than 150° C., and dissolve readily in solvents which are compatible with a polyglutarimide resin, thus, forming LOR compositions which have excellent film-forming characteristics and provide a controlled dissolution rate which may be either less or greater than that of the resin alone.

Preferred examples of the poly-hydroxy aromatic compounds include 2,3,4,2',3',4'-hexahydroxybenzophenone of Formula (I); hexahydroxyspirobiindane of Formula (II); 2,4,2',4'-tetrahydroxybenzophenone of Formula (III); 1,1,1-tris-hydroxyphenylethane of Formula (IV), and 1,7-bis-(4-hydroxy-3-methoxyphenyl)-1,6-heptadiene-3,5-dione of Formula (V)

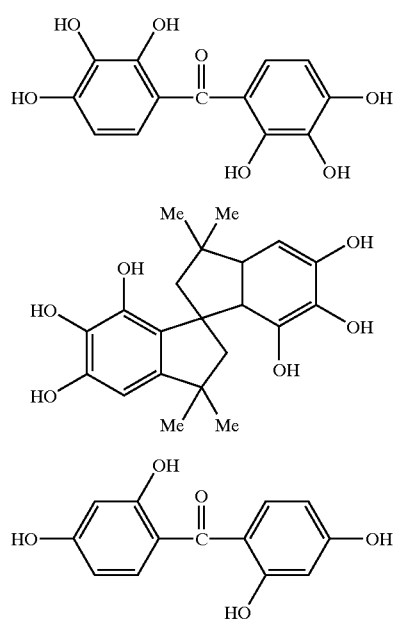

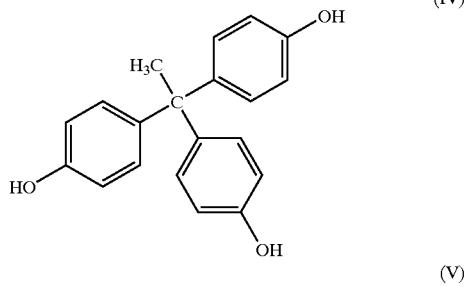

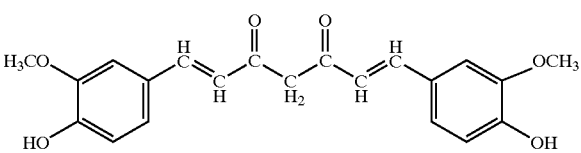

One or more of the hydroxy groups in formulae (I) to (V) may be replaced with an arylsulfonic group, preferably such as p-toluene sulfonyl, xylenesulfonyl, 1-naphthlene-sulfonyl or 2-naphthalene-sulfonyl groups as shown in the formulae below:

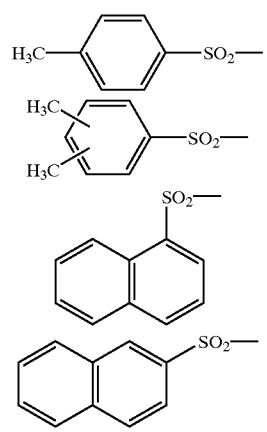

Using any one of these poly-hydroxy aromatic compounds as an additive to a PMGI resin having either a low or high molecular weight, and a suitable solvent such as cyclopentanone, a uniform striation-free LOR film with a thickness from less than about 0.05 microns to 1 micron can be deposited as a lift-off layer on a substrate, and the rate of undercut rate can be increased by a predetermined amount depending on the ratio of the poly-hydroxy aromatic compound to the polyglutaramide resin. This makes possible the use of a less aggressive developer of lower normality or a metal ion type which is more compatible with certain photoresists and substrates, and relatively short development times desirable for mass-production.

A reduction in the contribution of a poly-hydroxy aromatic compound to the dissolution rate of an LOR resist layer, can be obtained by esterifying one or more of the hydroxy groups on the phenolic rings with an aromatic sulfonylchloride, to form as a reaction product a mixture of partially sulfonated esters, and mixing said reaction product in a predetermined amount with a polyglutarimide resin in a selected solvent from which said LOR is formed by spin-coating on a substrate. The dissolution rate of the mixture and hence the degree of undercut is easily decreased, either by increasing the concentration of the esterified polyhydroxyphenolic component or by increasing the degree of esterification. By this means it is possible to achieve low undercut rates, which are required for submicron lift-off processes.

Suitable aromatic sulfonyl chlorides are those in which the aromatic moiety is a substituted or unsubstituted benzene or naphthalene. The preferred aromatic moieties are toluene, xylene and naphthalene. Most preferred is p-toluenesulfonyl chloride.

Preferred polyglutarimide resins are polydimethylglutarimide (PMGI) pre-formed polymers supplied commercially by Rohm and Haas for use in photoresists, containing about 60–80 mole % of cyclized imide moieties, and having a ratio of N—H vs N-methyl of about 5:5 to about 7:3, and a glass transition temperature of about 185–195° C. The weight average molecular weight of the standard PMGI resin is typically in the range of about 70,000 to about 110,000 and can be reduced by pre-exposing the solid resin to electron beam radiation of about 30–70 MRads. The reduction in molecular weight depends on the total amount of energy absorbed by the resin. The preferred molecular weights are selected on the basis of the dissolution rate of the resin in a standard developer. For the standard high molecular weight resin the preferred molecular weight ($M_w$) range is about 70,000 to about 90,000. For the pre-exposed low molecular weight ($M_w$) resin the preferred molecular weight range is below 30,000.

Suitable solvents useful for dissolving polyglutarimides such as PMGI, and the esterified or unesterified polyhydroxyphenolic compounds of the present invention include polar amide solvents such as dimethylformamide and N-methyl pyrollidone, ketonic solvents such as cyclopentanone, 2-pentanone and 2,4-pentanedione, cyclic ethers such as 1,3-dioxolane and tetrahydofuran, cyclic keto-ethers such as gamma-butyrolactone, hydroxylic polar solvents such as tetrahydrofurfuryl alcohol; and mixtures of the above.

Any one or more of the above solvents may be combined with solvents which alone may not dissolve PMGI such as ethyl lactate, propylene glycol monomethyl ether, propylene glycol methyl ether acetate, methylamyl ketone, cyclohexanone, methyl methoxypropionate, ethyl ethoxypropionate and the like.

Preferred solvent systems are those which give uniform striation-free, pinhole free coatings, and are either cyclopentanone or mixtures of cyclopentanone with propylene glycol monomethyl ether or tetrahydrofurfuryl alcohol, in which the cyclopentanone comprises at least about 70% by weight of the total solvent mixture.

Selected dyes may preferably be added to the LOR compositions of the present invention to modify the absorbance characteristics at a desired wavelength.

Other additives, well known to those skilled in the art, which may be optionally used to improve the coating quality of a spin-coating resist formulation include leveling agents, wetting agents and adhesion promoters. Such additives include for example, surfactants for improving the coatability and reducing the tendency for striations to form in the coated film. Such surfactants include polyoxyethylene lauryl ether, polyoxyethylene stearyl ether, polyoxyethylene nonylphenol ether, polyethylene glycol dilaurate and the like. Also there may be used fluorine-containing surfactants such as Megafac F171 and F173 (trade names of Dainippon Ink & Chemicals Inc.), Fluorad FC430 and FC431 (trade names of 3M Corp. Inc.), and Troysol MS-2, (trade name of Troy Corp.). The amount of surface active agent used is preferably 0.05 to 0.25% of the total solids.

The LOR solution is formed by dissolving the polyglutarimide resin, dissolution rate modifier and other additives if used in the selected coating solvent system. The term "effective amount" as applied to the amount of the dissolution rate modifier or modifiers in the LOR compositions of the present invention may be any amount that produces a desirable change in the dissolution rate of the LOR without adversely effecting the other properties of the LOR. The resin is preferably present in an amount of about 5 to about 15 weight percent. The dissolution rate modifier is typically present in an amount of about 5 to 50% of the total solids present in the solution. The solution is filtered through a polypropylene or Teflon filter to remove particulate matter. The LOR layer is formed by spin-coating the LOR solution onto a substrate to form a uniform layer of thickness of about 0.05 to about 1 microns, preferably about 0.05 to about 0.2 microns. The substrate materials are typically gallium arsenide, silicon, or ceramic which may have deposited on their surface other materials such as an oxide (e.g. silicon oxide), a nitride (e.g. silicon nitride), or a metal or alloy (e.g. nickel-ion or iron-ion metals or alloys). The most preferred substrate is ceramic such as alumina having a nickel-ion metal layer deposited thereon. The LOR layer is soft-baked by heating on a hot-plate or in a convection oven to a temperature of 140–200° C. and preferable from 150–170° C.

The imaging photoresist layer is deposited on top of the LOR layer to a uniform thickness of about 0.5 to about 2.0 microns. The imaging photoresist is usually a commercial positive resist of the type commonly used in the manufacture of semiconductor devices, either of the novolakdiazonaphthoquinone type or chemically amplified type. The top imaging photoresist layer should not intermix with the imaging resist layer.

The photoresist layer is exposed through a photomask containing the pattern to be transferred. The resist layer is soft-baked by heating to a temperature of 90–130° C. to remove most of the residual solvent. The pattern is transferred from a mask to the resist film using a conventional microlithographic imaging tool such as a contact-proximity printer or a stepper.

The exposing radiation is in the wavelength range 200–450 nm and may comprise a broad band or a narrow band, depending on the type of imaging tool required to transfer an image of the pattern on the photomask at the desired resolution. Narrow wavelength bands are obtained from the spectral output of a mercury or mercury-xenon lamp or an eximer laser. Preferred narrow bands are at 408, 435, 365, or 254 nm.

Suitable developers are commercially available alkaline aqueous developers such as tetramethyl ammonium hydroxide, and metal ion-containing such as sodium hydroxide, potassium hydroxide, potassium carbonate and the like. A preferred developer composition contains 2.38% tetramethyl ammonium hydroxide in DI water to which a surfactant may be added. Preferred commercial developers are Shipley LDD26W developer and AZ400 developer diluted 1:1 by volume with deionized water.

The present invention is further described in detail by means of the following Examples and Comparative Examples. All parts or percentages are by weight and all temperatures are in degrees Celsius unless explicitly stated otherwise.

Preliminary Determination of the Rate of Undercut and Propensity to Scum

A first non-imaging resist layer of a lift-off resist (LOR) of the present invention was deposited as follows. A uniform coating of the solution to be tested, of approximately 1000 Angstroms in thickness was deposited onto a silicon wafer by spin coating at a final speed of 3000 rpm for 30 seconds. The coated wafer was soft-baked on a hot plate at either 165° C. or 175° C. for 3 minutes. The film thickness was determined using a Nanospec thin film reflective interferrometric microscope.

A second photoresist layer (imaging layer) was deposited as follows. A uniform coating of approximately 1.2 micron thickness of Shipley S1818 positive resist, or 0.6 micron of Sumitomo PFI81 A7 positive resist, was deposited by spin-coating on top of the of the first layer. The coated wafer was soft-baked on a hotplate at 115° C. for 1 minute. The coating was examined for the presence intermixing which results in an interference pattern, having the appearance of circular bands radiating from the center of the substrate, which is easily observed by viewing the coated substrate in reflection under a narrow band visible light source. The wafer was then placed in proximity to a resolution mask comprising an array of square features having a range of dimensions in the range of about 2 to 20 microns, and exposed for a predetermined time to a collimated light beam produced from a Mercury Xenon light source providing uniform radiation in the range of wavelengths 330–450 nm. The exposure time was that required to replicate the dimensions of the mask features in the developed resist film. Following exposure, the wafer was soft-baked on a hotplate at 115° C. for 1 minute.

The rate of undercut in the LOR layer occurring during development of the latent image formed upon exposure of the top photoresist layer was determined as follows. The wafer was placed in a clean petri-dish and 50 ml of either Shipley LDD26W developer (comprising 2.38% of TMAH plus a surfactant in deionized water), or AZ 400 proprietary metal ion-containing developer diluted 1:1 with deionized water, was added. The wafer was removed from the developer after about 30 seconds, rinsed with DI water and blown dry with $N_2$ gas. The wafer was then inspected under a light microscope, and the 20 micron features studied to determine visually if 1 micron of undercut in the lower resist layer had been achieved. If 1 micron had not been achieved, the wafer was placed back into the petri-dish and removed after a further period of time and repeatedly thereafter, at approximately 15 seconds to 5 minute intervals depending upon the dissolution rate, which was typically in the range from 0.03 to 2 microns per minute. The total accumulated development time required to attain 1 micron of undercut was determined. The whole process was repeated without intermittently stopping the development, and the time for 1 micron undercut was determined and compared with the result obtained with intermittent development. If the results were within agreement by 10%, the value reported was that obtained with continual development. If the results differed by more than 10% the process was repeated until two consecutive results agreed within 10%.

Scum was observed to be present in the undercut region if the side-walls of the imaged squares were surrounded by hazy rather than a clear area of undercut, or in the case of severe scumming by a mass of particulates.

EXAMPLE 1

An LOR composition comprising a mixture of 0.92 wt % of 2,3,4,2,'3'4'-hexahydroxybenzophenone of Formula (I) obtained from Saint Jean Photochemicals Co. as the dissolution rate modifier present in an amount of 14.5% of the total weight of solids, and 6.1 wt % of PMGI resin having a weight average molecular weight of 80,000 and 92.86 wt % of solvent comprising a mixture of 85% cyclopentanone and 15% of propylene glycol monomethyl ether, was prepared by rolling on a jar roller for 4 hours followed by filtration through a 0.20 micron Supor filter. The experimental procedure to determine the rate of undercut and propensity to scum described above was followed. After soft-baking at 175° C. the LOR film thickness was 0.01+/–0.005 microns. Shipley S1818 was used as the positive photoresist, which showed no intermixing with the LOR layer. After subsequent exposure and development in AZ400 (1:1) developer, the time for 1 micron of undercut was determined to be 1 minute and the undercut regions showed no evidence of scum.

EXAMPLE 2

The method according to Example 1 was repeated except that the dissolution rate modifier was hexahydroxyspirobiindane of Formula (II) obtained from Saint Jean Photochemicals Co. The photoresist showed no intermixing with the LOR layer. After subsequent exposure, the development time for 1 micron of undercut was determined to be 1 minute and the undercut regions showed no evidence of scum.

Comparative Example 1

The method according to Example 1 was repeated except that no dissolution rate modifier was present. The photoresist showed no intermixing with the LOR layer. After subsequent exposure, and development, essentially no dissolution of the LOR was observed and there was no undercut even after the unexposed positive resist upper layer had begun to dissolve.

EXAMPLE 3

The method according to Example 1 was repeated except that the developer was LDD26W. The photoresist showed no intermixing with the LOR layer. After subsequent exposure, the development time for 1 micron of undercut was determined to be less than 45 seconds and the undercut regions showed no evidence of scum.

Comparative Example 2

The method according to Example 3 was repeated except that no dissolution rate modifier was present. The photoresist showed no intermixing with the LOR layer and after subsequent exposure, the development time for 1 micron of undercut was determined to be 6 minutes.

EXAMPLE 4

The method according to Example 3 was repeated except that the dissolution rate modifier was 2,4,2',4'-tetrahydroxybenzophenone of Formula (III) obtained from Aldrich and was present in an amount of 0.56 wt % being 7.0% of the total weight of solids, and the PMGI resin was present in an amount of 7.46 wt %, and the solvent was present in an amount of 91.92%, and the LOR layer was soft-baked at 165° C., and the positive photoresist was Sumitomo PFI 81A7 which showed no intermixing with the LOR layer. After subsequent exposure, the development time for 1 micron of undercut was determined to be 50 seconds and the undercut regions showed no evidence of scum.

EXAMPLE 5

The method according to Example 4 was repeated except that the dissolution rate modifier was 2,3,4,2,'3'4'- hexahydroxybenzophenone of Formula (I). The photoresist showed no intermixing with the LOR layer. After subsequent exposure, the development time for 1 micron of undercut was determined to be 50 seconds and the undercut regions showed no evidence of scum.

Comparative Example 3

The method according to Example 4 was repeated except that no dissolution rate modifier was present. The photoresist showed no intermixing with the LOR layer and after subsequent exposure, the development time for 1 micron of undercut was determined to be 1.5 minutes.

EXAMPLE 6

The method according to Example 4 was repeated except that the dissolution rate modifier was 1,1,1-tris-(4-hydroxyphenyl)ethane of Formula (IV) obtained from Aldrich and was present in an amount of 0.28 wt % being 9.1% of the total weight of solids, and the PMGI resin had a weight average molecular weight of 15,000 and was present in an amount of 2.75 wt %, and the solvent was present in an amount of 96.97%. The photoresist showed no intermixing with the LOR layer and after subsequent exposure, the time for development of 1 micron of undercut was determined to be 1.5 minutes and the undercut regions showed no evidence of scum.

EXAMPLE 7

The method according to Example 4 was repeated using as the dissolution rate modifier 1,7-bis-(4-hydroxy-3-methoxyphenyl)-1,6-heptadiene-3,5-dione, obtained from Aldrich as the compound Curcumin. The photoresist showed no intermixing with the LOR layer. After subsequent exposure, the development time for 1 micron of undercut less than 30 seconds.

Comparative Example 4

The method according to Example 6 was repeated except that no dissolution rate modifier was present. The photoresist showed no intermixing with the LOR layer and after subsequent exposure, the development time for 1 micron of undercut was determined to be 2 minutes.

The results of Examples 1–7 and Comparative Examples 1–4 show that in each case a poly-hydroxy aromatic dissolution rate modifier of the present invention can be added to a solvent and a PMGI resin of either a high or low molecular weight to form an LOR, in an amount which does not lead to any intermixing with the photoresist layer, said amount being sufficient to produce a significant increase in the value of the undercut rate compared with an LOR comprising a PMGI resin alone, using either an aggressive tetramethylammonium hydroxide developer or a weaker metal ion containing developer, producing an undercut region which is free from scum, and in the case of the mixtures of a dissolution rate modifier and PMGI having a high molecular weight, the undercut rate exceeds the value obtained using a low molecular weight PMGI alone.

Synthesis Example 1

A mixture comprising p-toluenesulfonate esters of 2,4,2',4'-tetra-hydroxybenzophenone(THBP) of Formula (III) was prepared as follows. THBP, 2.5 gms (0.01 moles), potassium carbonate 14.2 gms (0.1 moles) was dissolved in 100 ml THF and to it was added 4 gms (0.02 moles) of p-toluenesulfonyl chloride. Accordingly the starting mole ratio of the p-toluenesulfonyl chloride to THBP was 2:1. The mixture was refluxed for 16 hours, cooled and filtered. The filtrate was precipitated in water, filtered, washed with water and dried in a vacuum oven overnight. HPLC analysis showed the presence of 3 isomers in addition to THBP.

Synthesis Example 2

The method according to Synthesis Example 1 was repeated except that the mole ratio of the p-toluenesulfonyl chloride to THBP was 1:1 and the mixture was refluxed for 5 hours. HPLC analysis showed the presence of two isomers in addition to THBP.

EXAMPLE 8

The method according to Example 4 was repeated using as the dissolution rate modifier the mixture of p-toluenesulfonate esters of THBP prepared as described in Synthesis Example 1. The photoresist showed no intermixing with the LOR layer and after subsequent exposure, the development time for 1 micron of undercut was determined to be greater than 6 minutes.

EXAMPLE 9

The method according to Example 7 was repeated using as the dissolution rate modifier, the mixture of p-toluenesulfonate esters of THBP prepared as described in Synthesis Example 2. The photoresist showed no intermixing with the LOR layer. After subsequent exposure, the development time for 1 micron of undercut was determined to be 3 minutes.

Synthesis Example 3

The method according to Synthesis Example 1 was repeated except that the polyhydroxy compound was 1,7-bis-(4-hydroxy-3-methoxyphenyl)-1,6-heptadiene-3,5-dione, obtained from Aldrich as the compound Curcumin. TLC analysis showed the presence of one isomer.

Synthesis Example 4

The method according to Synthesis Example 3 was repeated except that the mole ratio of the p-toluenesulfonyl chloride to Curcumin was 1:1 and the mixture was refluxed for 5 hours. TLC analysis showed the presence of two isomers in addition to Curcumin.

EXAMPLE 10

The method according to Example 9 was repeated except that the poly was a mixture of 36.4 wt % of dye 1,7-bis-(4-hydroxy-3-methoxyphenyl)-1,6-heptadiene-3,5-dione and 13.6 wt % of the p-toluenesulfonate diester of curcumin prepared according to Synthesis Example 3, and 50 wt % of the reaction product of Synthesis Example 4, said mixture being present in an amount of 2.09 wt % being 52.2% of the total solids, and the PMGI resin was present in an amount of 1.9 wt %, and the solvent was present in an amount of 96 wt %. The photoresist showed no intermixing with the LOR layer. After subsequent exposure, the development time for one micron of undercut was determined to be 50 seconds, the undercut regions showed no evidence of scum.

The results of Examples 8–10 and Comparative Examples 3 and 4, show that, in each case, a dissolution rate modifier comprising a mixture of toluenesulfonate esters of a polyhydroxy aromatic compound of the present invention can be added to a solvent and a PMGI resin of either a high or low molecular weight to form an LOR, in an amount which does not lead to any intermixing with the photoresist layer, said amount being sufficient to produce a significant decrease in the value of the undercut rate compared with an LOR comprising a PMGI resin alone, using either an aggressive tetramethyl-ammonium hydroxide developer or a weaker metal ion-containing developer, producing an undercut region which is free from scum, and in the case of the mixtures of a dissolution rate modifier and PMGI having a high molecular weight, the undercut rate exceeds the value obtained using a low molecular weight PMGI alone.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A composition useful for a lift-off resist in a bilayer metal lift-off process, which comprises a mixture of at least one solvent, at least one polyglutarimide resin and an effective amount of at least one poly-hydroxy aromatic compound dissolution rate modifier selected from a group consisting of 2,3,4,2',3',4'-hexahydroxybenzophenone; hexahydroxyspirobiindane; 2,4,2',4',-tetrahydroxybenzophenone; 1,1,1-tris-hydroxyphenylethane; 1,7-bis-(4-hydroxy-3-methoxyphenyl)-1,6-heptadiene-3,5-dione and at least one arylsulfonate ester of these poly-hydroxy aromatic compounds; wherein said arylsulfonate ester group is selected from the group consisting of p-toluene-sulfonyl, xylenesulfonyl, 1-naphthalenesulfonyl and 2-naphthalenesulfonyl.

2. The composition of claim 1 wherein the poly-hydroxy aromatic compound is 2,3,4,2',3',4'-hexahydroxybenzophenone.

3. The composition of claim 1 wherein the poly-hydroxy aromatic compound is hexahydroxyspirobiindane.

4. The composition of claim 1 wherein the poly-hydroxy aromatic compound is 2,4,2',4'-tetrahydroxybenzophenone.

5. The composition of claim 1 wherein the poly-hydroxy aromatic compound is 1,1,1-tris-hydroxyphenylethane.

6. The composition of claim 1 wherein the poly-hydroxy aromatic compound is 1,7-bis-(4-hydroxy-3-methoxyphenyl)-1,6-heptadiene-3,5-dione.

7. The composition of claim 1 wherein the poly-hydroxy aromatic compound is at least one arylsulfonic ester group selected from the group consisting of p-toluene sulfonyl, xylenesulfonyl, 1-naphthalenesulfonyl and 2-naphthalenesulfonyl.

8. The composition of claim 1 where the polyglutarimide resin is polydimethylglutarimide.

9. The composition of claim 8 wherein the polydimethylglutarimide resin contains 60–80 mole % of imide moieties, having a ratio of N—H vs N-methyl of about 5:5 to about 7:3, and a glass transition temperature of about 185–195° C.

10. The composition of claim 9 wherein the concentration of the polyglutarimide resin is about 5 to 15 percent by weight of the solvent.

11. The composition of claim 1 wherein the amount of poly-hydroxy aromatic compound is from about 5 to about 50 percent by weight of the polyglutarimide resin.

12. A composite article comprising (1) a microelectronic substrate; (2) a layer of lift-off resist comprising a composition of claim 1 on top of the microelectronic substrate; and (3) a layer of positive-imaging photoresist on top of the layer of lift-off resist.

13. The composite article of claim 12 wherein the substrate is gallium arsenide, silicon or ceramic.

14. The composite article of claim 13 wherein an oxide, a nitride, a metal or an alloy is deposited upon the gallium arsenide, silicon or ceramic.

15. The composite article of claim 14 wherein the substrate is ceramic with a nickel-ion metal deposited thereon.

16. The composite article of claim 12 wherein the positive-imaging photoresist is a novolak-diazonaphthoquinone type.

17. The composite article of claim 12 wherein the layer of lift-off resist has an uniform thickness of about 0.05 to about 1 microns.

18. The composite article of claim 12 wherein the layer of positive-imaging photoresist has an uniform thickness of about 0.5 to about 2.0 microns.

* * * * *